(12) United States Patent
Tudose (10) Patent No.: US 8,730,079 B2
(45) Date of Patent: May 20, 2014

(54) SAMPLING RATE CONVERTER DATA FLOW CONTROL MECHANISM

(75) Inventor: Andrei Tudose, Chateauneuf (FR)

(73) Assignee: ST-Ericsson SA, Plan-les-Ouates (CH)

( * ) Notice: Subject to any disclaimer, the term of this patent is extended or adjusted under 35 U.S.C. 154(b) by 44 days.

(21) Appl. No.: 13/522,469

(22) PCT Filed: Jan. 7, 2011

(86) PCT No.: PCT/EP2011/000034
§ 371 (c)(1),
(2), (4) Date: Aug. 24, 2012

(87) PCT Pub. No.: WO2011/085947
PCT Pub. Date: Jul. 21, 2011

(65) Prior Publication Data
US 2013/0002457 A1    Jan. 3, 2013

(30) Foreign Application Priority Data

Jan. 15, 2010 (EP) ................................. 10368001
Dec. 1, 2010 (EP) .................................. 10290635

(51) Int. Cl.
*H03M 7/00* (2006.01)

(52) U.S. Cl.
USPC ........... 341/161; 341/143; 341/155; 375/259; 375/262; 375/267; 375/299

(58) Field of Classification Search
USPC ............ 341/61, 115, 143, 118, 120; 375/259, 375/262, 267, 260, 299, 341
See application file for complete search history.

(56) References Cited

U.S. PATENT DOCUMENTS 6,091,765 A * 7/2000 Pietzold et al. ............... 375/219
6,343,207 B1 * 1/2002 Hessel et al. ................... 455/86
6,539,052 B1 * 3/2003 Hessel et al. .................. 375/225
7,061,409 B1   6/2006 Jaentti et al.
7,158,045 B1 * 1/2007 Gudmunson et al. ......... 348/515
7,339,503 B1 * 3/2008 Elenes ............................ 341/61
7,499,106 B1 * 3/2009 Gudmunson et al. ......... 348/536
7,847,864 B1 * 12/2010 Jaffe et al. ..................... 348/724
8,320,511 B2 * 11/2012 Chen et al. .................... 375/371

(Continued)

OTHER PUBLICATIONS

Patent Cooperation Treaty International Search Report and Written Opinion of PCT/EP2011/000034; M. Marongiu; Mar. 18, 2011; 11 pages.

Zhuan Ye et al. "An FPGA Based All-Digital Transmitter with Radio Frequency Output for Software Defined Radio", Design, Automation & Test in Europe Conference & Exhibition, 2007, IEEE, Apr. 1, 2007, pp. 1-6, ISBN: 978-3-9810801-2-4.

(Continued)

*Primary Examiner* — Linh Nguyen
(74) *Attorney, Agent, or Firm* — Howison & Arnott, LLP (57) ABSTRACT

A sampling rate converter that converts an incoming stream of data, clocked at a first frequency, to an output stream of data that can be clocked at a second frequency is described. The sampling rate converter up-samples an incoming data stream, filters the up-sampled incoming data stream, interpolates the filtered up-sampled data stream, and then stores the interpolated filtered up-sampled incoming data stream in a FIFO at the first frequency. The interpolated filtered up-sampled data can then be read from the FIFO at the second frequency. A control block that includes a numerically controlled oscillator (NCO) that generated the first frequency is provided. Control of the NCO's production of the first frequency is based on the status of the FIFO, how the data stream is modulated, and the sampling rate ratio of the incoming data stream with respect to the output or read rate of data stream.

14 Claims, 6 Drawing Sheets

(56) References Cited

U.S. PATENT DOCUMENTS

| | | | |
|---|---|---|---|
| 8,456,977 B2 * | 6/2013 | Honma | 369/59.21 |
| 8,571,119 B2 * | 10/2013 | Naik et al. | 375/259 |
| 2002/0003871 A1 * | 1/2002 | Stacey et al. | 379/360 |
| 2005/0163276 A1 | 7/2005 | Sudo et al. | |
| 2012/0087225 A1 * | 4/2012 | Honma | 369/59.19 |

OTHER PUBLICATIONS

Patent Cooperation Treaty—International Preliminary Report on Patentability of PCT/EP2011/000034; Yolaine Cussac; Jul. 17, 2012; 7 pages.

* cited by examiner

| Mean Δ Pointer | DELTA_NCO_CT_FIFO |
|---|---|
| 1.5..2 | 4 |
| 2..2.5 | 3 |
| 2.5..3 | 2 |
| 3..3.5 | 1 |
| 3.5..4.5 | 0 |
| 4.5..5 | -1 |
| 5..5.5 | -2 |
| 5.5...6 | -3 |
| 6...6.5 | -4 |

SAMPLING RATE CONVERTER DATA FLOW CONTROL MECHANISM

CROSS-REFERENCE TO RELATED APPLICATIONS

This application is a U.S. National Phase application submitted under 35 U.S.C. §371 of Patent Cooperation Treaty application serial no. PCT/EP2011/000034, filed Jan. 7, 2011, and entitled SAMPLING RATE CONVERTER DATA FLOW CONTROL MECHANISM, which application claims priority to European patent application serial no. 10368001.3, filed Jan. 15, 2010, and entitled SAMPLING RATE CONVERTER DATA FLOW CONTROL MECHANISM, and also claims' priority to European patent application serial no. 10290635.1, filed Dec. 1, 2010, and entitled SAMPLING RATE CONVERTER DATA FLOW CONTROL MECHANISM.

Patent Cooperation Treaty application serial no. PCT/EP2011/000034, published as WO 2011/085947, and European patent application serial no. 10368001.3 and 10290635.1, are incorporated herein by reference.

TECHNICAL FIELD

The present invention relates to the field of wireless communications and in particular to a sampling rate converter data flow control mechanism.

BACKGROUND

A Sampling Rate Converter (SRC) converts a signal from an input sampling rate to an output sampling rate while preserving the signal's quality.

One of the major issues of SRCs is the data flow control, meaning the capability of sustaining data generation on its output at the requested output sampling rate while using the available number of samples available on its input at input sampling rate.

The sampling rate converter data flow control mechanism regulates the data flow of the sampling rate converter so that the sampling rate converter will always be able to provide the requested number of samples on its output starting from a defined number of samples on its input.

Typically, sampling rate converters generate a defined number of samples on their output starting from a defined number of samples on their input. Their functionality is dependent on the sustainability of a defined exact ratio between the input and output sampling rate.

The typical SRC problem is that the ratio between the output and input sampling rates (sampling rate ratio) is different from the one supported by the SRC due to the limited accuracy of frequency synthesizers. In this case the SRC will start making errors due to either the lack of input samples for generating output samples (in case the actual sampling rate ratio is larger than the SRC supported sampling rate) or to too many input samples that cannot be stored for generating the requested number of output samples (in case the actual sampling rate is lower than the SRC supported sampling rate).

SUMMARY

It is an object of the present invention to provide a process for regulating the SRC data flow.

It is another object of the present invention to preserve the SRC data flow even if the output sampling rate is being derived from a frequency modulated synthesizer.

The invention embodiments are directed to a data flow control mechanism that regulates the SRC data flow so that even if the actual sampling rate ratio is different than the predefined sampling rate ratio, the SRC will preserve its functionality by dynamically adjusting its operation for accommodating the actual sampling rate ratio.

A second exemplary part of the invention is that the SRC data flow is preserved even in the context of the output sampling rate being derived from a frequency modulated synthesizer, provided that the modulating signal and the modulation index is known.

Exemplary objects are achieved by a sampling rate converter which comprises a circuit for up-sampling the incoming data stream; a filter for filtering the up-sampled incoming data stream; an interpolation filter for interpolating the filtered up-sampled incoming stream of data; a FIFO for storing the interpolated filtered up-sampled incoming stream of data; wherein the storing is performed at the first frequency and the reading of the FIFO is performed at the second frequency so as to output the stored data at a second corresponding rate.

The sampling-rate-converter may further comprise a control block comprising a numerically controlled oscillator (NCO) used for generating the first frequency. Control of the NCO is based on information representative of the status of the FIFO as well as information representative of the modulation of the data.

In one embodiment the information representative of the modulation of the data is derived from the counting, during a predetermined period of the number of quadrants passed by the vector corresponding to the modulation signal.

The predetermined period often corresponds to a set of 50 symbols to be modulated.

The interpolation filter is based either on dynamic or static interpolation.

The sampling rate converter is often based on a linear interpolation filter of a first order, combined with a 4× up-sampling.

Invention embodiments achieve a sampling rate conversion of an incoming stream of data, clocked at a first frequency, and output at a second frequency. The process includes up-sampling the incoming data stream; filtering the up-sampled incoming data stream; interpolating the filtered up-sampled incoming stream of data; storing into a FIFO the interpolated filtered up-sampled incoming stream of data, the storing being performed at the first frequency and the reading of the FIFO being performed at the second frequency so as to output the stored data at a second corresponding rate. Additionally, the process comprises controlling a numerically controlled oscillator (NCO) used for generating the first frequency on the basis of information representative of the status of the FIFO and also information representative of the modulation of the data.

In one particular embodiment, the information representative of the modulation of the data is derived from the counting, during a predetermined period of the number of quadrants passed by the vector corresponding to the modulation signal.

The sampling-rate-converter and the process for performing sample rate conversion are particularly adapted for a transmission circuit of a User Equipment for a wireless telecommunication network.

BRIEF DESCRIPTION OF THE DRAWINGS

Other features of one or more embodiments of the invention will be best understood by reference to the following detailed description when read in conjunction with the accompanying drawings.

DETAILED DESCRIPTION

Figure 1:
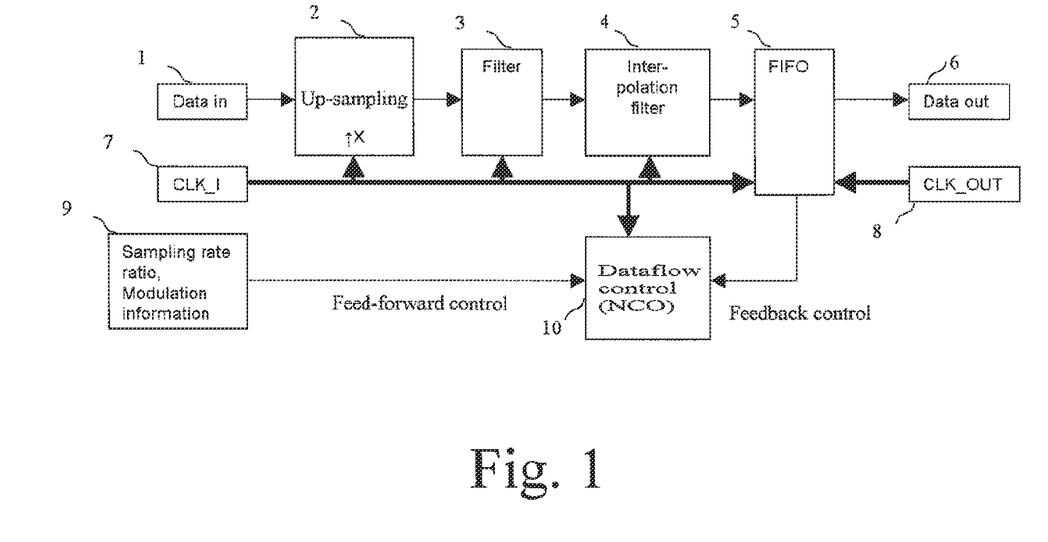
FIG. 1 illustrates an SRC equipped with the data flow control mechanism.

With respect to FIG. 1, there is illustrated one embodiment of a sample-rate converter for converting a stream of incoming data—generated by a block Data_in 1—sampled with a first clock CLK_IN (generated by block 7) and that passes the data without corrupting its integrity while changing the sampling rate.

The SRC converter is particularly intended for a transmitter of a User Equipment, such as a mobile phone, for a wireless telecommunication network.

For that purpose, the incoming data is input into a block 2, which performs an oversampling or more particularly an up-sampling of the incoming data with a predefined factor X. It should be noticed that up-sampling differs from the so-called oversampling by the adding of "0" in the up-sampled stream of data. The output of block 2 is connected to the input of a filtering block 3 and then to an interpolation filter 4, which are used for the purpose of providing an interpolated over-sampled stream of data.

As known by the skilled man, the sampling-rate conversation requires interpolation, and a new set of data needs to be generated starting from the original one. Basically, interpolation filter 4 can be based on two mechanisms:

1. dynamic interpolation,
2. static interpolation.

The dynamic interpolation mechanism is based on the adjustment of the transfer characteristic of the interpolation filter for each interpolated sample. By doing so, a perfect notch may be realized at the position of the original sampling frequency. The attenuation of the signal's image (around Fs_input) is one of the major requirements of a sampling rate converter. The complexity of implementing a dynamically self-adjustable interpolation filter makes this approach attractive when large rejections are required and when the use of up-sampling (or up-sampling equivalences) are prohibited.

The static interpolation mechanism may also be used, but is limited by the fact that in the process of re-sampling, the original signal's image (around Fs_input) will be aliased on top of the wanted signal. This image may be attenuated by:

1. Increasing the order of the interpolation filter,
2. Increasing the over-sampling factor before applying interpolation of a certain order.

Interpolation filter 4 can be based on one of those two mechanisms or, even, a mix of both techniques for the purpose of achieving an optimal implementation.

In one embodiment, the SRC is based on a linear interpolation filter of a first order, combined with a 4× up-sampling.

A first order interpolation is used over a "0"-order one (re-sampling). Indeed, as justified by the table below, in order to achieve 70 dB attenuation of the original sampling frequency images (assuming a sampled signal of 500 kHz), an over-sampling rate of 1536 would be necessary and certainly not easy to implement (the over-sampling ratio is referred to the minimum sampling ratio to be used for the 500 kHz signal, meaning 1 MS/s).

| OSR | Attn @ 500 kHz (dB) | Attn @ OSR(MHz) – 500 kHz (dB) | Attn @ OSR(MHz) + 500 kHz (dB) |
|---|---|---|---|
| 24 | 0.006 | 33.45 | 33.81 |
| 48 | 0.001 | 39.559 | 39.737 |
| 96 | 0.00038 | 45.621 | 45.7 |
| 1536 | 0.0000015 | 69.75 | 69.75 |

A similar analysis, for the case of a linear interpolation leads to the following figures:

| OSR | Attn @ 500 kHz (dB) | Attn @ OSR(MHz) – 500 kHz (dB) | Attn @ OSR(MHz) + 500 kHz (dB) |
|---|---|---|---|
| 16 | 0.03 | 59.7 | 60.7 |
| 24 | 0.012 | 66.9 | 67.6 |
| 48 | 0.003 | 79.112 | 79.474 |

It appears from the figures above, that a 2× up-sampling combined with a linear interpolation leads to almost 80 dB of attenuation of the image signals.

In one embodiment, a poly-phase filter, associated with a 4× up-sampling is used. As the original OSR for this example was 24 MS/s, the 4× up-sampling leads to an OSR of 96 MS/s. The implemented attenuation of the aliased components (around the 96 MHz frequency) inherent to linear interpolation is in excess of 91 dB—in the table above an additional line should be added:

$$OSR=96, ATTN@500\ kHz=0.0007, Attn@OSR(MHz)-500\ kHz=91.2\ dB, Attn@OSR(Mhz)+500\ kHz=91.4\ dB$$

The filter used for removing the 24/48/72 MHz images is: [1 3 6 10 12 12 10 6 3 1].

Figure 2A:
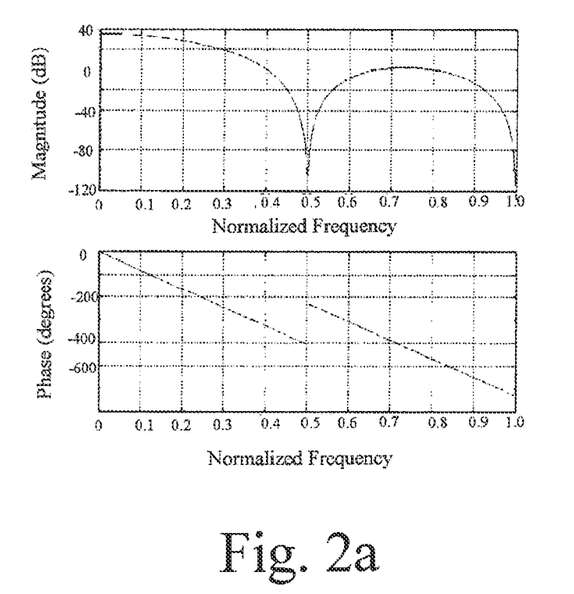
FIG. 2a illustrates the transfer function of the interpolation filter.

For the sake of illustration, the transfer function of this filter is shown in FIG. 2a, which shows that the images attenuation levels are in excess of 80 dBs: 23.5 MHz is equivalent to 23.5/48=0.48958. The attenuation at this freq. is −62 dB thus the overall filtering is 36(DC transfer level)+62=98 dB.

The linear interpolation process performed by block 4 produces new raw data from the 4× up-samples data. The accuracy of the interpolation is imposed by the number of bits quantifying the position of the interpolated sample with respect to the adjacent samples of the original signal.

The number of bits used in this exemplary embodiment for implementing the linear interpolation has been set to 18. With this setting the maximum interpolation error that is performed is 144.44 Hz, which means that the data generated by interpolation can be calculated on a grid which is a maximum of 116 Hz/−144 Hz away from the "wanted" grid. This means that if the SRC is supposed to output 38.578125 MS/s while starting from 24 MS/s (BT channel 67), it will generate actually 38.57800888 MS/s, which means it will generate 116.12114 to many samples during one second.

This effect causes "data flow" problems, which will be handled by the data flow control block 10 in order to comply with the requested data flow rate from the previous example having an output of 38.578125 MS/s.

Figure 3:
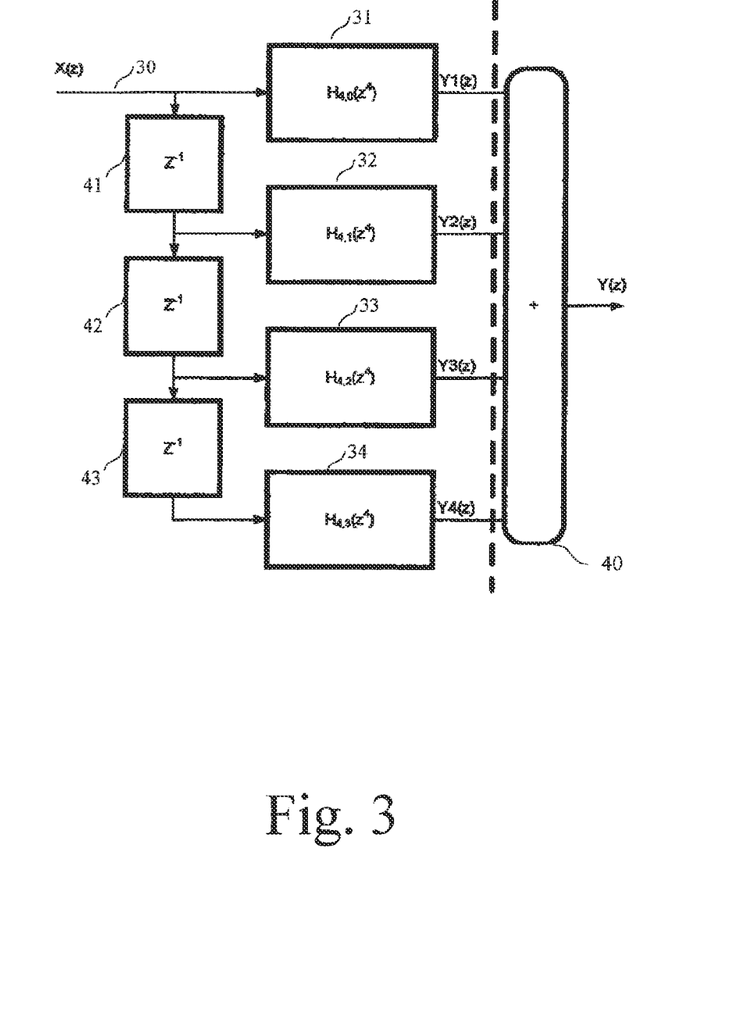
FIG. 3 illustrates the four phase decomposition filter used in one embodiment.

In order to limit the sampling frequency, the implementation of the interpolation filter is based on four-phase decomposition, as illustrated in FIG. 3, which shows three delay blocks 41, 42, 43 and four individual blocks 31-34, which respectively processes the incoming sample X(z) and each delayed version of the samples. Each individual block 31-34 outputs one component $Y1(z), Y2(Z), Y3(Z)$ and $Y4(Z)$ which can then added by means of an adder 40.

In one particular embodiment the adder 40 can be omitted as there is no need of the actual addition. What is required is the interpolated values between the four equally time spaced outputs $Y1(z) \ldots Y4(z)$. The interpolation process is driven by a NCO (Numerical Controlled Oscillator) controlled by an internal constant value NCO_CT inside the data flow control block 10 which selects:

1. The number of (output) samples that need to be generated for 1 input frequency period;
2. The branch $(Y_x-Y_{x-1})$ where the interpolated values lie; and
3. The actual position within the branch(s).

As seen in FIG. 1, the sampling-rate—converter of FIG. 1 is clocked under the control of a data flow control block 10 which includes a numerically controlled oscillator. Block 10 thus provides the clocking system for all components of the SRC, including up-sampling block 2, filter 3, interpolation filter 4 and also the writing mechanism of FIFO 5. To achieve this, block 10 receives control information that provides monitored status of FIFO 5 and information generated by a block 9 that enables the data flow control 10 to monitor the ratio of the output and input sampling rates and the modulation of the data. The resulting information is stored into an accumulator (e.g. an 18 bit accumulator) carrying a parameter NCO_CO (NCO constant) used for controlling the rising and falling edges of the clocking.

The embodiment of FIG. 1 is particularly characterized by the fact that two distinctive control mechanisms are used for controlling the NCO oscillator:
1) a feedback control mechanism based on information representative of the status of the FIFO 5;
2) a feed-forward control mechanism based on information representative of the modulation of the data to be transmitted and the ratio between the input and output sample rates;

1) Feedback control mechanism

The so-called feedback control mechanism is based on the measurement of the difference between the SRC supported data flow and the actual data flow. The feedback control mechanism is based on the monitoring of the FIFO state indicator. The FIFO state indicator is the instrument measuring the difference between the SRC supported data flow and the SRC actual data flow. If the actual data flow is higher than the supported data flow the FIFO will be emptied as the speed of taking samples out of the FIFO is higher than the speed of generating new samples into the FIFO. The FIFO state indicator will signal such a situation to the data-flow control block 10, which will speed up the process of generating output samples. The opposite will happen if the actual data flow is lower than the supported data flow.

If one considers the BT channel 0 for instance, the input sampling frequency of the SRC is 24 MHz. The mean output sampling frequency is 2402 MHz*2.5/20/8=37.53125 M Hz.

The NCO_CT (NCO constant) to be accumulated is set to ROUND(2^18*24/37.53125)=167632.

Because of the rounding function, the output rate supported will be 24 MHz*167632/(2*18)=37.5313544 MHz thus −104.395 Hz less than requested.

Figure 4:
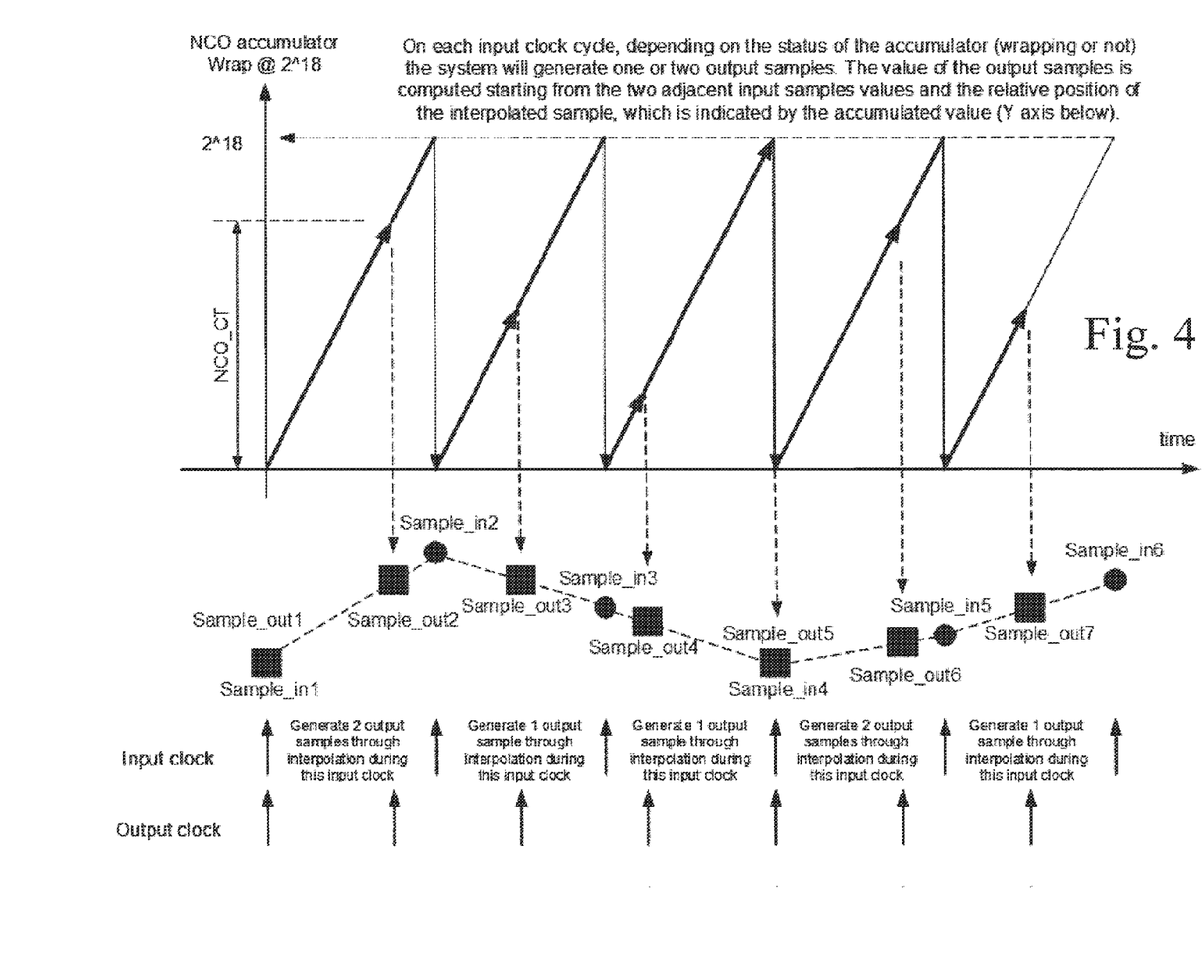
FIG. 4 illustrates a general overview of the way the NCO controls the interpolation process generating the required number of output samples and the correct values of these samples.

The timing diagram of FIG. 4 illustrates a general overview of the way the NCO controls the SRC.

Figure 2B:
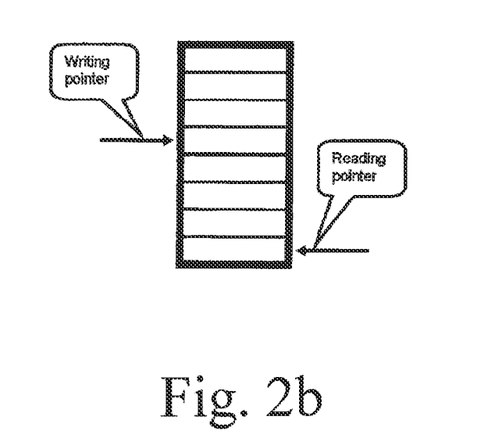
FIG. 2b illustrates the write and read registers of the FIFO 5.

The FIFO block 5 comprises 8 registers and its status is monitored as described below.

At start-up the FIFO 5 is written but not read. The difference between the writing pointer and the reading pointer is monitored. As soon as this difference is 4 (half way FIFO) the reading operation is enabled. As the difference (between read and write pointers) gets smaller (indication of the fact that the SRC doesn't produce enough samples) the SRC will be "speed-up" by lowering the NCO_CT by 1LSB. The opposite happens if the pointer difference increases.

Figure 5:
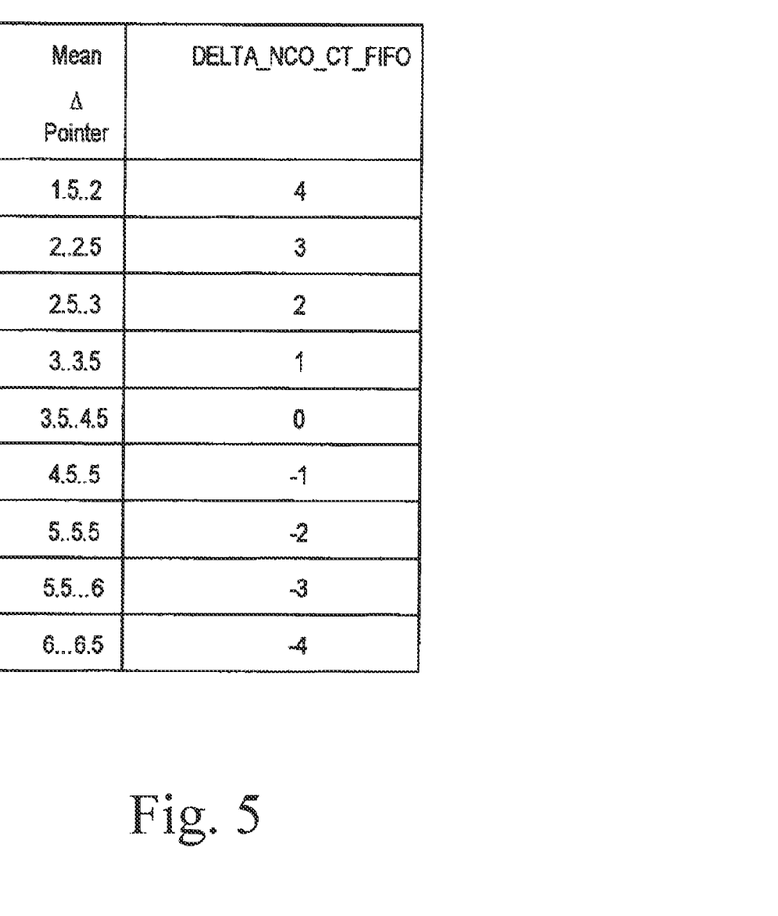
FIG. 5 shows a table of values that can be used for correcting the NCO of data flow control block 10—see the feedback control input.

The estimation of the FIFO status takes place on chunks on 50 BT symbols and the NCO_CT is updated in accordance In one embodiment, the feedback of the feedback control mechanism is based on the following table:

| Mean Δ Pointer | DELTA_NCO_CT_FIFO |
|---|---|
| 1.5 ... 2 | 4 |
| 2 ... 2.5 | 3 |
| 2.5 ... 3 | 2 |
| 3 ... 3.5 | 1 |
| 3.5 ... 4.5 | 0 |
| 4.5 ... 5 | −1 |
| 5 ... 5.5 | −2 |
| 5.5 ... 6 | −3 |
| 6 ... 6.5 | −4 |

The ideal NCO_CT (used at start-up) may be changed by max. 4 LSB. While 1 LSB leads to a data flow rate change of approx. 6 ppm, the max. change inflicted by changing the NCO is quantified to be +/−24 ppm.

This type of feedback loop is intended to control data flow issues created by:
1. the limited number of bits employed for the NCO_CT,
2. the error of the 24 MHz clock and of the RF synthesized clock.

The limited number of bits used for NCO_CT may lead to max. 3 ppm data flow error (0.5LSB) which [[are]] well under the range covered by the proposed algorithm.

The 24 MHz frequency is synthesized with 23 bits on the fractional section whereas the reference clock is around 1 MHz, leading to an error in the range of 1 MHz/2^23 which is equivalent with 0.11 ppm.

The RF synthesized frequency error is less than 1 ppm (locked frequency error will be less than 2.4 kHz). Under the assumption of a reference freq. of 52 MHz the fractional bus width of the RF PLL needs to be in excess of 16 bits.

All cases will be covered by the +/−24 ppm range of the proposed mechanism.

Practically, the FIFO indicator used in the feedback control, mechanism can be embodied as follows:

On the start of each chunk of 50 us during 1024 events of 48 MHz (actually implemented as rising and falling edges of the 24 MHz) the following is performed:

Delta_Pointer=Pointer_Read-Pointer_Write % calculate the pointer delta

Signed_Delta_Pointer=Delta_Pointer-4 for accumulating the error only

Accumulate Signed_Delta_Pointer-->Acc_Pointer_Error.

At the end of the 1024 events, the sum is divided by 512 (round to the nearest). With the assumption that on average the delta pointer is 4.511 (500 reads @ 4 and 524 reads 5) the Acc_Poiter_Error is expected to be 524. Dividing by 512 leads to 1.xxx (less than 1.5) which is interpreted as Error Pointer being between 4.5 and 5, leading to DELTA_NCO CT FIFO being −1. This particular implementation is limiting the assessment of the FIFO position to only 1024/48=21.33 us of the 50 us chunk but this is not seen as a limitation due to the very slow changing rate of the FIFO indicator.

2) Feed-forward control mechanism

In addition to the described feedback control mechanism, the data flow control block 10 is also controlled by a so-called feed-forward mechanism. The feed flow and mechanism is based on the regulation of the SRC data flow when the SRC actual data flow is controlled in a known manner. An example is regulating the SRC data flow when the SRC output rate (CLK_OUT) is derived from a synthesizer, which is frequency modulated. A frequency modulated synthesizer runs faster or slower than the "central frequency" depending on the modulation data and the modulation index. In effect, if the modulating data leads to a higher synthesized frequency than the central one, the SRC output rate will also be higher. A conventional SRC would fail to correctly operate because of the difference between the actual and supported data flows. Thanks to the feed-forward mechanism the SRC data flow controller is used in such a way to adjust the actual data flow using the modulation information. When means that knowing that a synthesizer will be asked to run faster, the output data rate will be increased and so will the SRC actual data flow. The opposite happens if due to modulation information the synthesized frequency will be lower.

Practically, the feed-forward mechanism monitors the data modulation process—and thus the data flow rate resulting from the modulated data (due to its impact on the DPLL derived clock) and correspondingly adjusts the NCO_CT parameter controlling the Numerically Controller Oscillator of block 10.

In one embodiment, the modulated data is analyzed during a period corresponding to a set of 50 symbols being transmitted. Over such a period the number of quadrants passed by the vector (clock—anticlock—wise) is calculated and the corresponding parameter—the mean modulating frequency over 50 symbols—is used for adjusting the NCO_CT digital parameter controlling the Numerically Controlled Oscillator of block 10.

It should be noticed that the adjusted NCO_CT at time Tk is representative for the previous 50 us period but it is applied for the next 50 symbols. This will in effect lead to some signal distortion. However, simulations have indicated that while keeping the update rate at 50 us, the distortion inflicted on the signal is negligible (DEVM <-40 dB). Simulations have also indicated that while processing PRBS data there may be no need for this correction, as the FIFO state is stable due to the random properties of the signal. This control loop is however built-in for safety reasons. In addition the control loop is necessary for supporting test modes where-in the signal is not PRBS but "all 1" or "all 0" in GFSK or continuous jumps of a certain angle in PSK modes.

Practically, in one embodiment, the feed-forward correction mechanism is implemented as follows:

Consider the case of continuous jumps of 135°.

Figure 6:
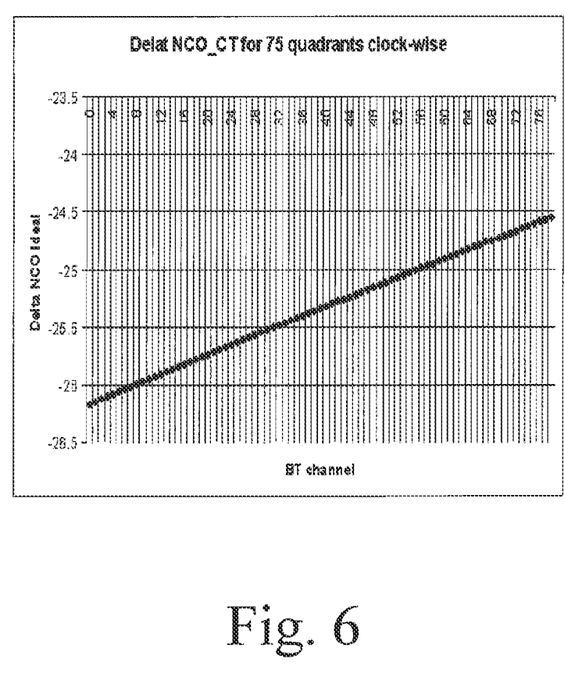
FIG. 6 is a graph representative of the ideal Delta NCO parameter as a function of the sampling rate ratio (Fout is imposed by the selected BT channel: Fout=(2402+BT_channel)MHz; Fin is 24 MHz) and the modulation signal behavior (in this case characterized by a 75 quadrants advancement during the period of analysis); see the feed-forward control input in FIG. 1.

The number of quadrants covered during 50 us is 75, which is equivalent with a modulation frequency of 375 kHz. The ideal NCO_CT supporting the new DCO frequency is calculated to be within the 25 . . . 26 units range depending on the BT channel, as shown in the FIG. 6.

Therefore, in the embodiment being considered, the following calculation is applied for computing the DELTA_NCO_CT_MOD, being the constant to be applied for compensating the modulation impact is:

DELTA_NCO_CT_MOD=44*Nr_Quadr/128 for BT Channel 0:31

DELTA_NCO_CT_MOD=43*Nr_Quadr/128 for BT Channel 32:60

DELTA_NCO_CT_MOD=42*Nr_Quadr/128 for BT Channel 61:78

The division by 128 has to be implemented using rounding to the nearest.

Each of the two DELTA_NCO_CT will be applied to the NCO_CT values depending on the settings of two enable signals:

ENABLE_NCO_CT_FIFO
ENABLE_NCO_CT_MOD

Every 50 us the NCO_CT_ACTUAL is updated as $$NCO\_CT\_ACTUAL = \\ NCO\_CT + ENABLE\_NCO\_CT\_FIFO * DELTA\_NCO\_CT\_FIFO + \\ ENABLE\_NCO\_CT\_MOD * DELTA\_NCO\_CT\_MOD$$

3) Data flow errors assessment

Both dataflow algorithms are targeting the dataflow. This section assesses the FIFO activity during a regular packet without using these algorithms.

The longest packet to be supported in a real BT link is DH5 thus less than 3 ms.

The NCO_CT quantization is less than 3 ppm. The 24 MHz and RF LO freq. errors are assessed to be less than 2 ppm.

The first calculation doesn't take into account the impact of modulation. Taking all other mechanisms mentioned above into account leads to a very worse case of 5 ppm dataflow error.

A dataflow error of 5 ppm means that during 1second, instead of generating 38 MS (case of the BT channel 30) will generate 38*1.000005=38.00019 MS/s which means 190 additional samples during Is which converts to 0.57 samples during 3 ms. Having only 0.57 additional/less samples during a slot doesn't require the use of the FIFO control mechanism.

First conclusion: the other mechanism, taking into account the impact of the modulation contents over the data flow is highly dependent on the modulation content. During BT regular operating mode the FIFO control may be switched OFF: ENABLE_NCO_CT_FIF=0.

Simulations have shown that due to the PRBS nature of the signal the FIFO is very stable—it doesn't change state during several simulated ms.

Second conclusion: for actual BT packets this mechanism can be switched off as well. ENABLE_NCO_CT_MOD=0

Actual signals have whatever characteristics. In order to "randomize" them they are passed through a "whitening" sequence. This sequence is specified in the BT specification as being the D7+D4+1 polynomial.

The length of this polynomial is 127 symbols. Based on its start-up sequence (seed) it may produce "all 1 s" on its output if driven with a particular sequence (that can be generated easily by applying "all 1 s" on its input. In this case a sequence of 127 "1 s" will be generated. In order to continue this sequence the incoming signal needs to repeat itself. Theoretically it is possible to have "all 1 s" even after whitening but it is impossible to have this for two consecutive packets because the seed of the whitening sequence changes for each slot so if a packet is lost due to this very unlikely behavior, data will be whitened during the next one when resend using a new seed.

Nevertheless, there exists a tiny chance that a packet even after whitening will generate a repetitive code that will lead to a significant mean frequency drift over the 3 ms. The brute force method is to increase the FIFO length to +/−19 samples, which will cover the worst case for 3 ms or enable the modulation compensation. The +/−19 samples FIFO is roughly estimated to cost about 0.01 mm2. The alternative is to implement +/−4 samples FIFO and keep the modulation compensation algorithm ON during normal BT operation.

It has been described how to achieve effective sampling rate conversion by taking advantageous effect of the two feedback control and feedforward control mechanisms.

The advantage of the exemplary feed-back SRC data flow control mechanism is that it allows the SRC to function without errors in the presence of small variations of the sampling rate ratio. When the sampling rate ratio is not perfectly controlled the lack of such a mechanism leads to errors inside the SRC, which inflict a degradation of the signal quality.

Small variations of the sampling rate ratio are common to systems that employ two different synthesizers controlling the input and the output data rates of the SRC.

The advantage of the feed-forward SRC data flow control mechanism is that it allows the SRC to function without errors in case the data flow varies in a known way. A typical case is the use of such a SRC in a chain where the output sampling rate is derived from a modulated synthesizer, like in the case of Polar transmitter architectures.

The invention claimed is:

1. A sampling rate converter for performing a sampling rate conversion of an incoming stream of data clocked at a first frequency and output at a second frequency; the converter comprising:
    an up-sampling circuit adapted to up-sample the incoming data stream;
    a filter adapted to filter the up-sampled incoming data stream;
    an interpolation filter adapted to interpolate the filtered up-sampled incoming stream of data;
    a FIFO adapted to store the interpolated filtered up-sampled incoming stream of data (the IFUI stream of data), the FIFO being adapted to store the IFUI stream of data at the first frequency and being further adapted to enable reading of the IFUI stream of data from the FIFO at the second frequency so as to output the stored IFUI stream of data at a second corresponding rate;
    a control block comprising a numerically controlled oscillator (NCO) wherein the NCO is adapted to generate the first frequency; and wherein control of the NCO is based on information representative of the status of the FIFO, information representative of the modulation of the stream of data, and a ratio of sampling rate change between the incoming stream of data and output stream of data.

2. The sampling rate converter according to claim 1, wherein the information representative of the modulation of the stream of data is derived from a count, during a predetermined period, of a number of quadrants passed by a vector corresponding to a modulated symbol of a wireless telecommunication protocol.

3. The sampling rate converter according to claim 2, wherein the predetermined period corresponds to a set of 50 symbols to be modulated.

4. The sampling rate converter according to claim 1, wherein the interpolation filter is based on dynamic interpolation.

5. The sampling rate converter according to claim 1, wherein the interpolation filter is based on static interpolation.

6. The sampling rate converter according to claim 1, wherein the interpolation filter is based on a linear interpolation filter of a first order, combined with a 4× up-sampling.

7. The sampling rate converter according to claim 1, wherein the sampling rate converter is integrated into a transmission circuit of a User Equipment for a wireless telecommunication network.

8. A mobile communication device comprising a transmission circuit wherein the transmission circuit comprises sampling rate converter adapted to perform a sampling rate conversion of an incoming data stream clocked at a first frequency and an output stream of data clocked at a second frequency; the converter comprising:
    an up-sampling circuit adapted to up-sample the incoming data stream;
    a filter adapted to filter the up-sampled incoming data stream;
    an interpolation filter adapted to interpolate the filtered up-sampled incoming data stream data;
    a FIFO adapted to store the interpolated filtered up-sampled incoming data stream (the IFUI data stream), the FIFO being adapted to store the IFUI data stream at the first frequency and being further adapted to enable reading of the IFUI data stream from the FIFO at the second frequency so as to output the stored IFUI data stream at a second corresponding rate;
    a control block comprising a numerically controlled oscillator (NCO) wherein the NCO is adapted to generate the first frequency; and wherein control of the NCO is based on information representative of FIFO status, representative of the modulation of the data stream, and representative of a sampling rate ratio of the sampling rate of the incoming data stream and the output data stream.

9. A process of performing a sampling rate conversion of an incoming data stream clocked at a first frequency and then output as an output data stream at a second frequency; the process comprising:
    up-sampling the incoming data stream;
    filtering the up-sampled incoming data stream;
    interpolating the filtered up-sampled incoming data stream;
    storing, into a FIFO, the interpolated filtered up-sampled incoming data stream (IFUI data stream), said storing being performed at the first frequency and the reading of said FIFO being performed at the second frequency so as to output the stored data at a second corresponding rate;
    controlling a numerically controlled oscillator (NCO) used to generate the first frequency based on information representative of a status of said FIFO, a modulation of the incoming data stream, and a ratio of the incoming data stream and the output data stream sampling rate change.

10. The process according to claim 9, wherein the information representative of the modulation of the incoming data stream is derived from a count, during a predetermined period, of a number of quadrants that pass by a vector corresponding to a modulated symbol.

11. The process according to claim 10, wherein the predetermined period corresponds to a set of 50 symbols to be modulated.

12. The process according to claim 9, wherein the interpolation filter is based on dynamic interpolation or static interpolation.

13. The process according to claim 9, wherein the interpolation filter is on a linear interpolation filter of a first order, combined with a 4× up-sampling.

14. The process according to claim 9, wherein the process is used in a transmission circuit of a User Equipment for a wireless telecommunication network.

* * * * *